United States Patent [19]
Huang

[11] Patent Number: 5,448,587
[45] Date of Patent: Sep. 5, 1995

[54] STRUCTURE OF LASER MODULE

[76] Inventor: Chaochi Huang, 9F, No. 185, Ta Tung Road Sec. 1, Hsi Chih Chen, Taipei Hsien,

[21] Appl. No.: 364,809

[22] Filed: Dec. 27, 1994

[51] Int. Cl.[6] .............................................. H01S 3/08
[52] U.S. Cl. ...................................... 372/107; 372/65; 372/103; 372/108
[58] Field of Search ..................... 378/107, 61; 372/65, 372/108, 103, 192

Primary Examiner—Léon Scott, Jr.
Attorney, Agent, or Firm—Bacon & Thomas

[57] ABSTRACT

A laser module includes a hollow, cylindrical casing having a tapered laser beam emitting hole at one end and a lens holder coupling portion at an opposite end, a lens holder having one end fitted into the lens holder coupling portion and an opposite end made with an inner thread, a lens mounted inside the casing and retained between a cushion ring and the lens holder; a focus adjustment socket having one end made with an outer thread threaded into the inner thread of the lens holder and an opposite end sealed with a locating cap; a control circuit board fastened to the locating cap and disposed inside the focus adjustment cap to carry a laser diode chip and a photo detector and controlled to drive the laser diode chip to emit a constant laser beam out of the casing through the lens.

4 Claims, 5 Drawing Sheets

STRUCTURE OF LASER MODULE

BACKGROUND OF THE INVENTION

The present invention is an improvement made on the laser module of U.S. patent application Ser. No. 08/237,132, and now U.S. Pat. No. 5,394,430 which is an invention of the present inventor.

U.S. patent application Ser. No. 08/237,132 disclosed a structure of laser module, as shown in FIG. 5, which comprises a hollow, cylindrical casing 5 having a tapered laser beam emitting hole 51 at one end and an inner thread 52 (not shown) at an opposite end; a lens 7 mounted inside the casing 5 and retained between a cushion ring 6 and a locating ring 8; a base 9 having an outer thread 91 threaded into the inner thread 54 (not shown) on the casing 5; a laser diode chip 93 and a photo detector 94 mounted on the base 9 at right angles and respectively connected to the contact pins 92 of the base 9. The base 9 has a platform 96 to carry the photo detector 94. When the contact pins 92 of the base 9 are connected to the control circuit board (not shown), the laser diode chip 93 is controlled to emit a constant laser beam out of the tapered laser beam emitting hole 51 of the casing 5 through the lens 7. This structure of laser module is simple in structure of practical in use. However, this structure of laser module still has drawbacks. Because the contact pins 92 of the base 9 must be welded to the control circuit board, the installation procedure of the laser module is complicated. During the installation, the contact pins 92 of the base 9 will be broken easily. This complicated installation procedure greatly increases the cost of the device.

SUMMARY OF THE INVENTION

The present invention has been accomplished to eliminate the drawbacks of U.S. patent application Ser. No. 08/237,132. According to one embodiment of the present invention, the laser module comprises a hollow, cylindrical casing having a tapered laser beam emitting hole at one end and a lens holder coupling portion at an opposite end, a lens holder having one end fitted into the lens holder coupling portion and an opposite end made with an inner thread, a lens mounted inside the casing and retained between a cushion ring and the lens holder; a focus adjustment socket having one end made with an outer thread threaded into the inner thread of the lens holder and an opposite end sealed with a locating cap; a control circuit board fastened to the locating cap and disposed inside the focus adjustment cap to carry a laser diode chip and a photo detector, and controlled to drive the laser diode chip to emit a constant laser beam out of the casing through the lens. According to another embodiment of the present invention, a heat dissipating silicone plate is mounted on the control circuit board to carry the laser diode chip and the photo detector. Because the laser diode chip and the photo detector are mounted on the control circuit board, the assembly process of the laser module is easy to perform.

DETAILED DESCRIPTION OF THE PREFERRED EMBODIMENT

Figure 1:
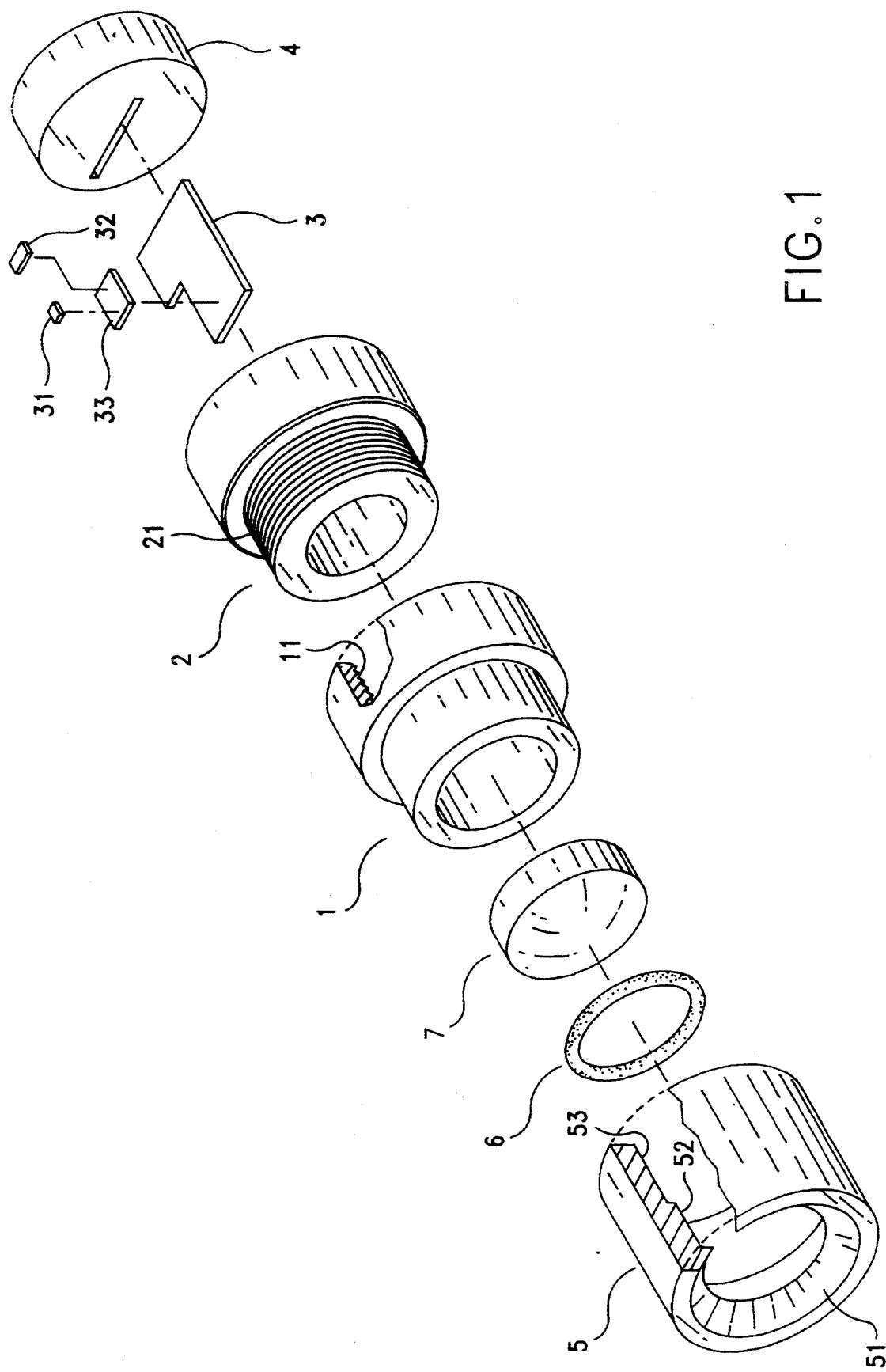
FIG. 1 is an exploded view of a laser module according to the present invention.
Figure 2:
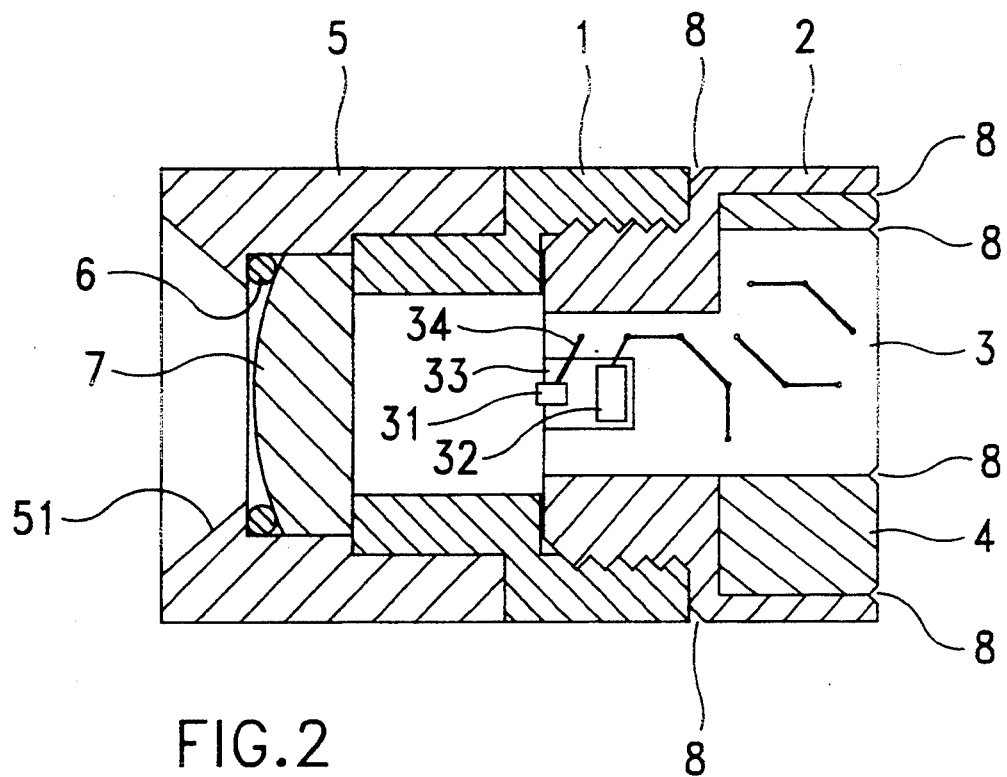
FIG. 2 is a top view in section of the laser module shown in FIG. 1.
Figure 2A:
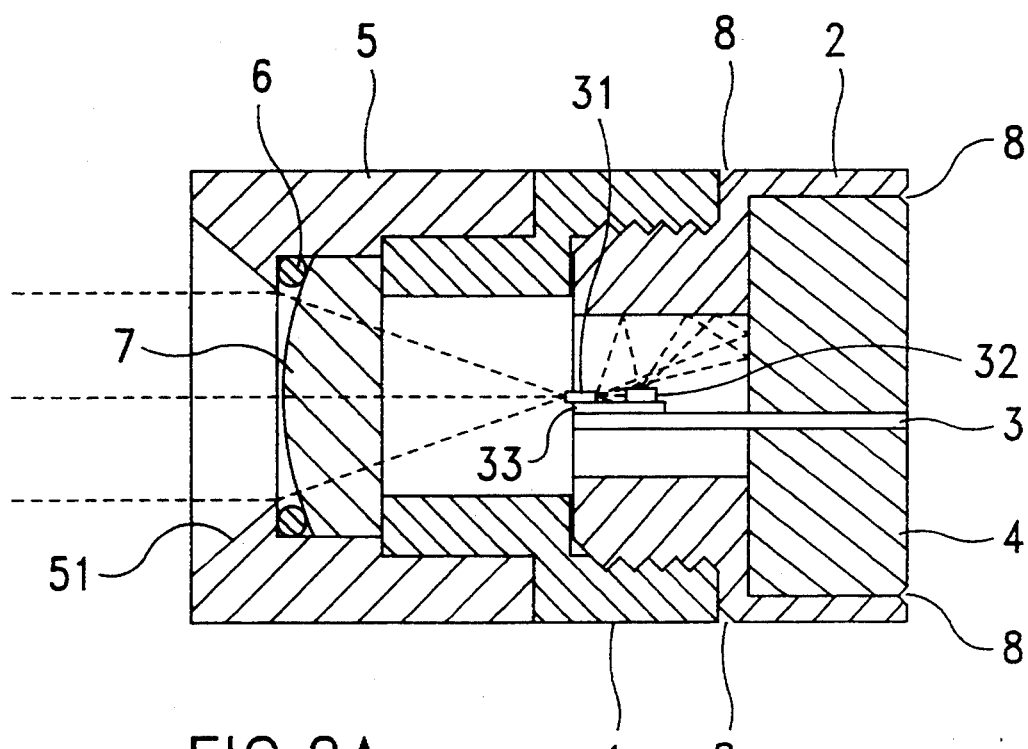
FIG. 2A is a side view in section of the laser module shown in FIG. 1, showing a laser beam emitted through the lens.

Referring to FIGS. 1, 2 and 2A, a laser module in accordance with one embodiment of the present invention is generally comprised of a cylindrical casing 5, a cushion ring 6, a lens 7, a lens holder 1, a focus adjustment socket 2, a control circuit board 3, and a locating cap 4. The cylindrical casing 5 is made in a hollow structure having a tapered laser beam emitting hole 51 at one end made gradually bigger toward the outside, a lens coupling portion 52 disposed behind the tapered laser beam emitting hole 51, which receives the cushion ring 6 and the lens 7, and a lens holder coupling portion 53 behind the lens coupling portion 52, which receives the lens holder 1 permitting the lens 7 to hold down the lens 7. The lens holder 1 has one end fitted into the lens holder coupling portion 52 to hold down the lens 1, and an opposite end made with an inner thread 11 threaded onto an outer thread 21 on the focus adjustment socket 2. The locating cap 4 is fastened to the focus adjustment socket 2 to hold the control circuit 3 inside the focus adjustment socket 2. A heat dissipating silicone plate 33 is mounted on the control circuit board 3 to hold a laser diode chip 31 and a photo detector 32. The laser diode chip 31 and the photo detector 32 are electrically connected to the circuit board 3 by conductors 34. When assembled, the focus adjustment socket 2 can be turned relative to the lens holder 1 to adjust the distance between the lens 7 and the laser diode chip 31, and therefore the focus of the laser module is adjusted. When the focus of the laser module is calibrated, the gaps 8 between the lens holder 1 and the focus adjustment socket 2 as well as the gaps 8 between the focus adjustment socket 2 and the locating cap 4 are sealed by a sealing glue.

Referring to FIG. 2A again, the laser diode chip 31 protrudes over the front side of the heat dissipating silicone plate 33 as well as the front side of the control circuit board 3. The size of the laser diode chip 31 is about 0.25 mm (length)×0.25 mm (width)×0.2 mm (thickness). When the laser diode chip 31 is welded to the heat dissipating silicone plate 33, the tin solder must not cover the front and top sides of the laser diode chip 31 so that the laser diode chip 31 can evenly emit a laser beam out of the laser beam emitting hole 51 of the casing 1 through the lens 7. When the laser diode chip 31 is triggered to emit a laser beam, the photo detector 32 detects the intensity of the laser beam and sends a feedback signal to the control circuit board 3 so that the control circuit board 3 controls the laser diode chip 31 to provide a constant output power. When the laser diode chip 31 works, the laser beam is focused by the lens 7 and emitted out of the casing 5 through the laser beam emitting hole 51.

Figure 3:
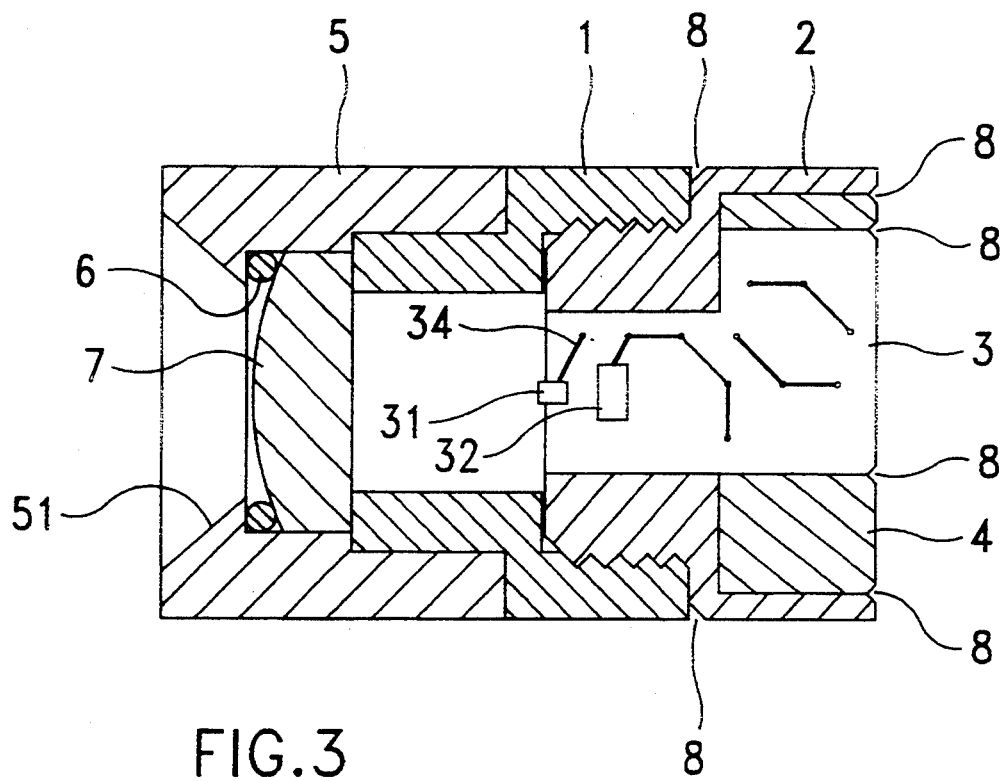
FIG. 3 is a top view in section of an alternate form of the present invention.
Figure 3A:
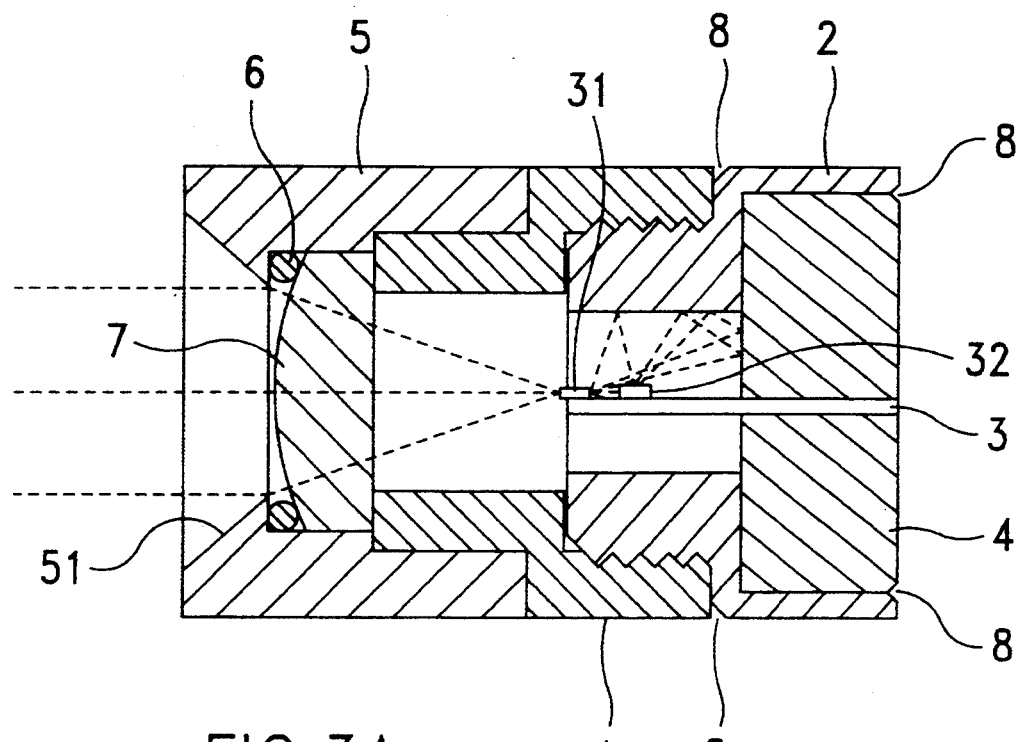
FIG. 3A is a side view in section of the laser module shown in FIG. 3, showing a laser beam emitted through the lens.

FIGS. 3 and 3A show an alternate of the present invention, in which the heat dissipating silicone plate 33 is eliminated, the laser diode chip 31 and the photo detector 32 are directly mounted on the control circuit board 3, and the laser diode chip 31 protrudes over the front side of the control circuit board 3.

Figure 4:
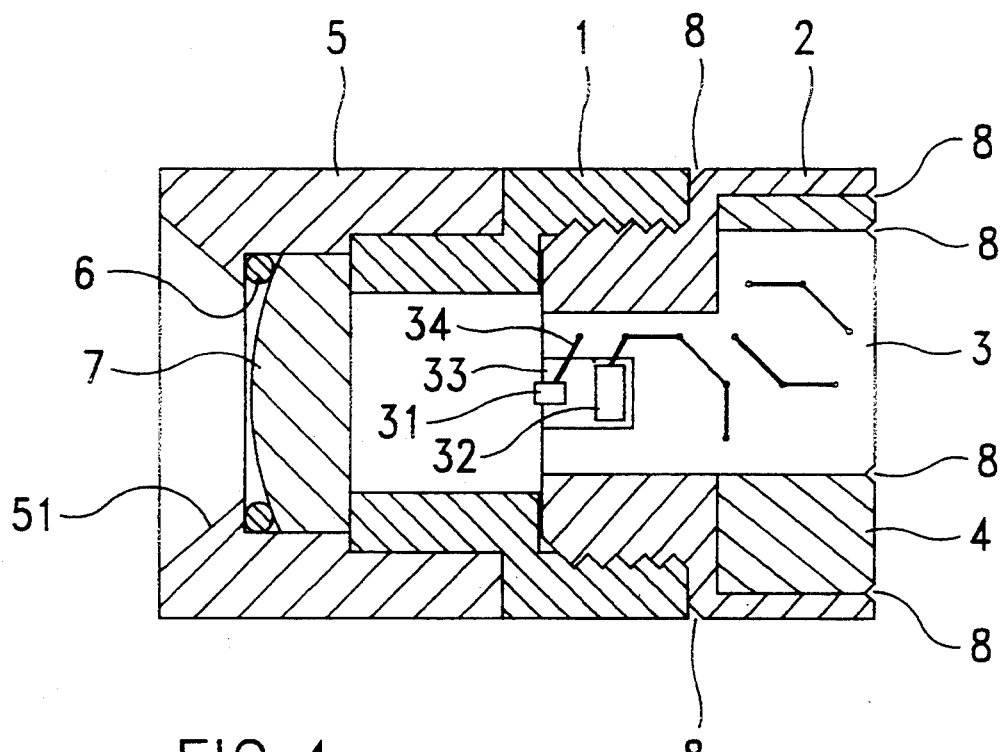
FIG. 4 is a top view in section of another alternate form of the present invention.
Figure 4A:
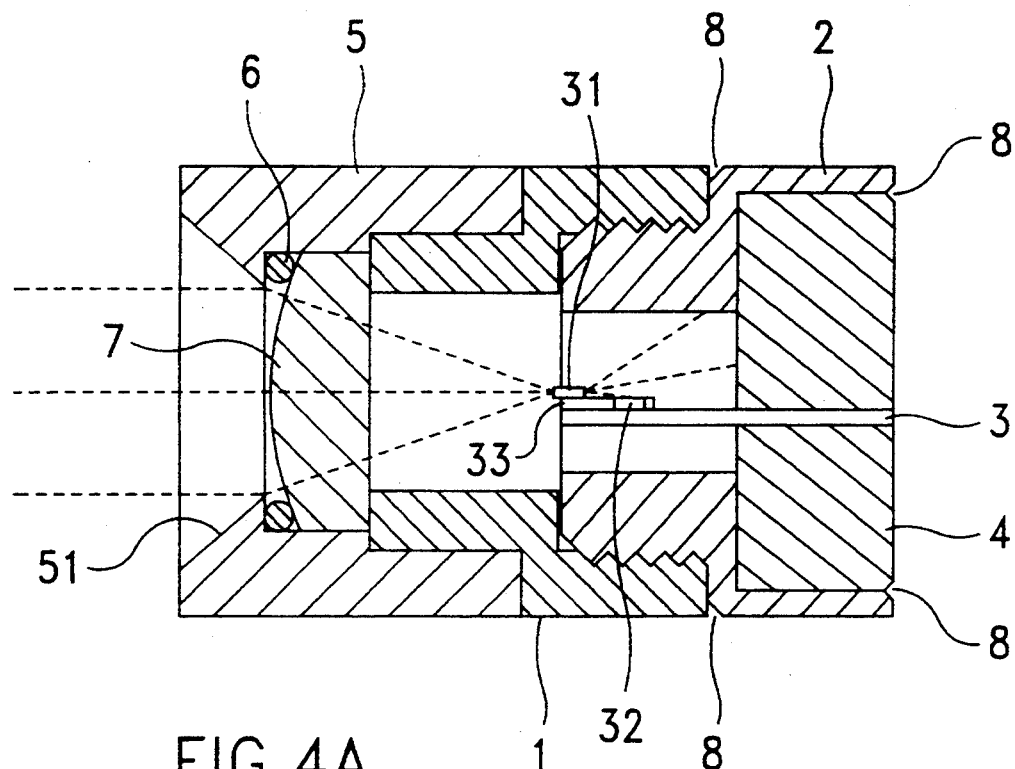
FIG. 4A is a side view in section of the laser module shown in FIG. 4, showing a laser beam emitted through the lens.
Figure 5:
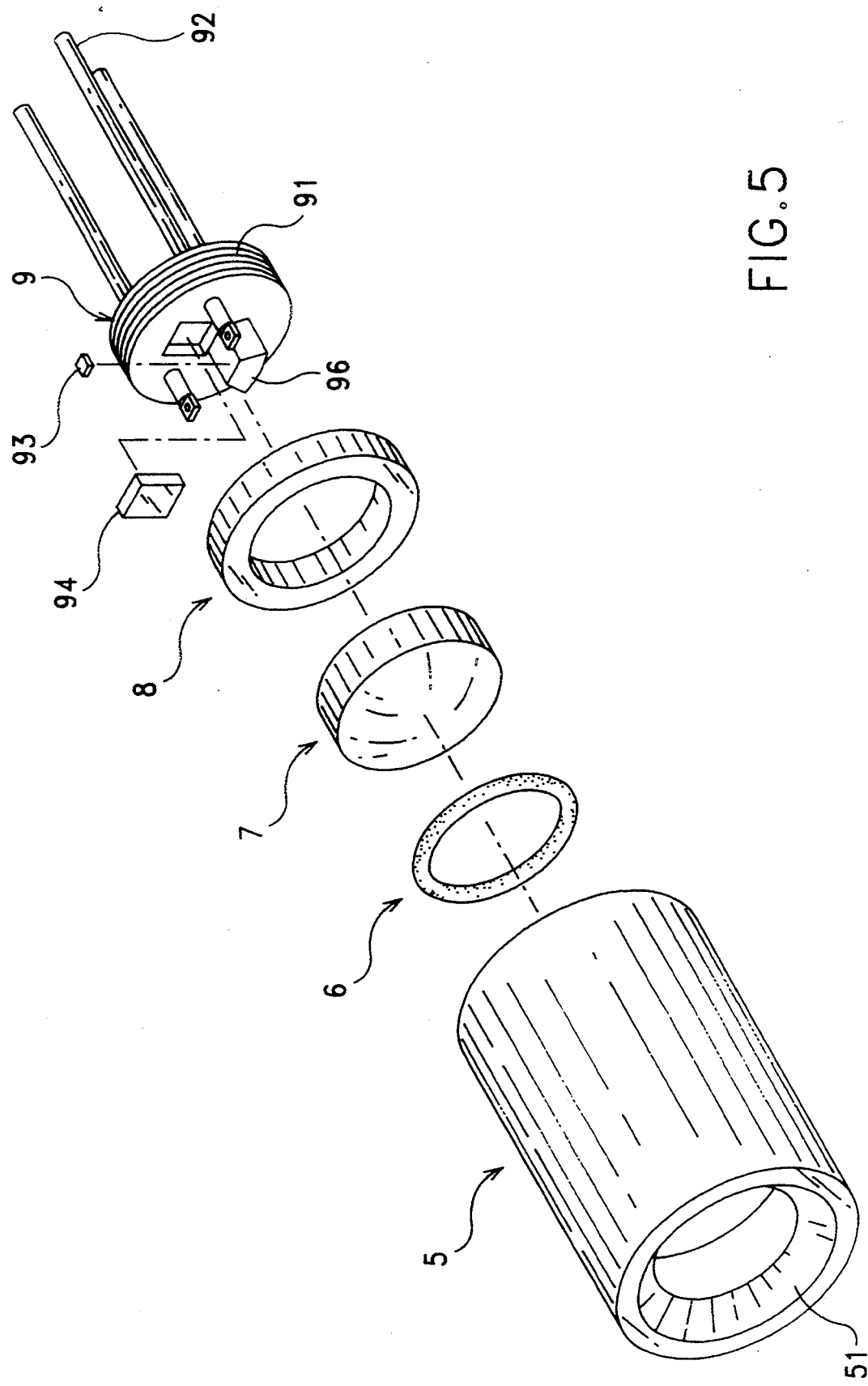
FIG. 5 is an exploded view of the laser module according to U.S. patent application Ser. No. 08/237,132.

FIGS. 4 and 4A show another alternate form of the present invention, in which the photo detector 32 is embedded in a hole (not shown) on the heat dissipating silicone plate 33 and having a detecting surface (not shown) exposed to the outside, and the laser diode chip 31 is mounted on the heat dissipating silicone plate 33 and partially extended out of the front side of the control circuit board 3.

While only few embodiments of the present invention have been shown and described, it will be understood that various modifications and changes could be made without departing from the spirit and scope of the invention.

What is claimed is:

1. A laser module of the type comprising: a hollow, cylindrical casing having a tapered laser beam emitting hole at one end made gradually bigger toward the outside, a lens holder coupling portion at an opposite end, a lens coupling portion communicated between said tapered laser beam emitting hole and said lens holder coupling portion; a cushion ring mounted in said lens coupling portion; a lens holder having one end fitted into said lens holder coupling portion and an opposite end made with an inner thread; a lens mounted in said lens coupling portion and retained between said cushion ring and said lens holder; a control circuit board; a laser diode chip controlled by said control circuit to emit a laser beam out of said tapered laser beam emitting hole of said casing through said lens; a photo detector controlled by said control circuit board to detect the intensity of the laser beam of said laser diode chip; and a control circuit holder means coupled to said lens holder to hold said control circuit board;

wherein said control circuit holder means comprises a focus adjustment socket having an outer thread at one end threaded into the inner thread of said lens holder and a coupling portion at an opposite end, and a locating cap fastened to the coupling portion of said focus adjustment socket to hold said control circuit board inside said focus adjustment socket; said laser diode chip and said photo detector are mounted on said control circuit board and disposed inside said focus adjustment socket; said laser diode chip having a front end protruding over a front side of said control circuit board.

2. The laser module of claim 1 which further comprises a heat dissipating silicone plate mounted on said control circuit board to carry said laser diode chip and said photo detector.

3. The laser module of claim 2 wherein said laser diode chip has a front end extruded out of a front side of said heat dissipating silicone plate.

4. The laser module of claim 2 wherein said photo detector is embedded in a hole on said heat dissipating silicone plate and having a detecting surface exposed to the outside.

* * * * *